United States Patent
Afonso Perez

(10) Patent No.: US 7,679,452 B2
(45) Date of Patent: Mar. 16, 2010

(54) AMPLIFIER ARRANGEMENT AND METHOD

(75) Inventor: Mauro Afonso Perez, Graz (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 11/989,555

(22) PCT Filed: Jul. 25, 2006

(86) PCT No.: PCT/EP2006/007340

§ 371 (c)(1),
(2), (4) Date: Apr. 27, 2009

(87) PCT Pub. No.: WO2007/012465

PCT Pub. Date: Feb. 1, 2007

(65) Prior Publication Data

US 2009/0219089 A1    Sep. 3, 2009

(30) Foreign Application Priority Data

Jul. 26, 2005    (EP)    .................................. 05016241

(51) Int. Cl.
*H03F 3/04*    (2006.01)
(52) U.S. Cl. ........................................ 330/311; 330/51
(58) Field of Classification Search ................. 330/311, 330/310, 150, 51, 98
See application file for complete search history.

(56) References Cited

U.S. PATENT DOCUMENTS

| | | | | |
|---|---|---|---|---|
| 4,250,463 | A * | 2/1981 | Foster | 330/298 |
| 4,622,498 | A * | 11/1986 | Lester | 315/382 |
| 5,648,743 | A * | 7/1997 | Nagaya et al. | 330/252 |
| 6,127,886 | A | 10/2000 | Khabbaz et al. | |
| 6,144,254 | A | 11/2000 | Irvine et al. | |
| 6,366,162 | B1 | 4/2002 | Angell et al. | |
| 7,570,119 | B2 * | 8/2009 | Hamaguchi | 330/311 |
| 2004/0056712 | A1 | 3/2004 | Lee et al. | |
| 2005/0068106 | A1 | 3/2005 | Irvine | |

* cited by examiner

*Primary Examiner*—Henry K Choe
(74) *Attorney, Agent, or Firm*—Cohen Pontani Lieberman & Pavane LLP

(57) ABSTRACT

An amplifier arrangement having a transistor arrangement comprising a first transistor (1) in common-emitter configuration and a second transistor (2) in common-base configuration. A switching device (7) couples, in a first mode of operation, the first transistor (1) to an input (3) of the amplifier arrangement and while the second transistor (2) forms a cascade stage. In a second mode of operation the second transistor (2) is coupled to the input (3). While high gain is achieved during the first mode, the second mode allows for high linearity without requiring inductive degeneration.

15 Claims, 2 Drawing Sheets

AMPLIFIER ARRANGEMENT AND METHOD

RELATED APPLICATIONS

This is a U.S. national stage of application No. PCT/EP2006/007340, filed on 25 Jul. 2006.

This patent application claims the priority of European patent application no. 05016241.1 filed Jul. 26, 2005, the disclosure content of which is hereby incorporated by reference.

FIELD OF THE INVENTION

The present invention relates to an amplifier arrangement and to a method to amplify a signal.

BACKGROUND OF THE INVENTION

Amplifier arrangements are widely used, for example as low-noise amplifiers in radio-frequency receiver arrangements. Depending on the power level of an incoming signal, it can be desirable to provide an amplifier with adjustable gain.

Usually, transistors are used for signal amplification. An amplifying transistor can be connected in common-emitter configuration. This results in relatively high gain, a low noise-figure and fairly good linearity when processing low level input signals.

In order to improve the linearity of an amplifier based on a common-emitter transistor configuration, it is possible to use degeneration. This is performed by connecting an inductor between the emitter terminal of the transistor and ground potential. When processing high-frequency signals, this results in a considerable improvement in linearity.

However, due to the fact that an inductor having a relatively large value is required, this inductor, due to its size, normally is an external component. In each case, the inductive degeneration requires either a relatively large chip area to integrate an inductor or an additional pin at an integrated circuit comprising the amplifier to connect an external, discrete inductor, resulting in higher costs.

SUMMARY OF THE INVENTION

It is an object of the present invention to provide an amplifier arrangement and a method which provide for improved linearity of signal amplification.

This and other objects are attained in accordance with one aspect of the present invention directed to an amplifier arrangement that has an input to receive a signal to be amplified and an output to provide an amplified signal derived from the input signal. A transistor arrangement couples the input to the output. The transistor arrangement comprises at least a first transistor and a second transistor. While the first transistor is connected in common-emitter configuration, the second transistor is designed in common-base configuration. The second transistor is coupled to the output of the amplifier arrangement. Further on, a switching device is provided which is coupled to the transistor arrangement such that in the first mode of operation of the amplifier arrangement, the first transistor is coupled to the input of the amplifier arrangement and the second transistor forms a cascode stage with respect to the first transistor. In the second mode of operation of the amplifier arrangement, the second transistor is coupled to the input of the amplifier arrangement.

In the first mode of operation, a common-emitter transistor with cascode configuration is provided. This results in a relatively high gain, a low-noise-figure and a fair linearity in order to handle low level input signals.

In the second mode of operation, the circuit presents a common-base transistor configuration. The second transistor, which in the first mode operates as a cascode stage, is the actual input transistor in the second mode. This second operation mode results in lower gain which is desirable in order to process input signals with higher input level, a higher noise-figure which is acceptable due to the higher input level signal, and a significantly higher linearity of the amplification.

In the second mode, the first transistor of the transistor arrangement may be part of a current source.

No external or internal inductor is needed to increase the linearity in the common-emitter structure.

Depending on the desired characteristics of an amplifier, a commutation between a common-emitter and a common-base transistor configuration is provided.

Due to the fact that an inductive degeneration is no longer required with the principle suggested, a smaller low-noise amplifier, LNA, with low current consumption can be realized.

In a preferred embodiment of the present invention, means are provided for suppression of Direct Current, DC-components of an incoming signal which are connected between the input of the amplifier arrangement and the switching device.

It is preferred to design the switching device such that in the first mode of operation the input of the amplifier arrangement is coupled to the base terminal of the first transistor and that in the second mode of operation the input of the amplifier arrangement is coupled to the emitter terminal of the second transistor.

By doing this, in the first mode of operation, the signal to be amplified is fed into the base terminal of the first transistor which is in a common-emitter configuration, while in the second mode of operation, the signal to be amplified is directly fed into the emitter terminal of the second transistor which operates in common-base configuration.

According to another preferred embodiment, means for operating point adjustment are provided which are connected to the base terminal of the first transistor.

It is preferable that the switching device has a control input to receive a control signal. The switching device may be designed such that the first or second mode of operation is activated as a function of a desired value of amplification of the amplifier arrangement.

The switching device may be designed such that the mode of operation is activated depending on the power level of an incoming signal.

The amplifier arrangement may preferably be integrated monolithically, partly or as a whole circuit. Preferably, bipolar circuit design is used.

In alternative embodiments, is also possible to use unipolar transistors, for example in a metal-oxide semiconductor, MOS integration technique, and/or BiCMOS.

In this case, the emitter corresponds to the source terminal, while the base terminal corresponds to the gate. Accordingly, the first transistor is in common-source configuration, while the second transistor is in common-gate configuration.

The amplifier arrangement is preferably used as a low-noise amplifier in a radio frequency, RF receiver. For example, the low-noise amplifier may couple an antenna to further signal processing means. The amplifier arrangement may be used on a radio frequency level as well as, after a frequency conversion for example, in an intermediate frequency or baseband frequency level.

While the different modes of operation preferably are chosen with respect to a desired amplification or gain value, it is also possible to switch between two different modes of operation depending on a modulation technique or other properties of a certain radio system, for example amplitude and/or phase modulation and/or frequency modulation, time and/or frequency duplexing, TDD, FDD, time division multiple access, TDMA, frequency division multiple access FDMA and/or code division multiple access, CDMA et cetera.

DETAILED DESCRIPTION OF THE DRAWINGS

Figure 1:
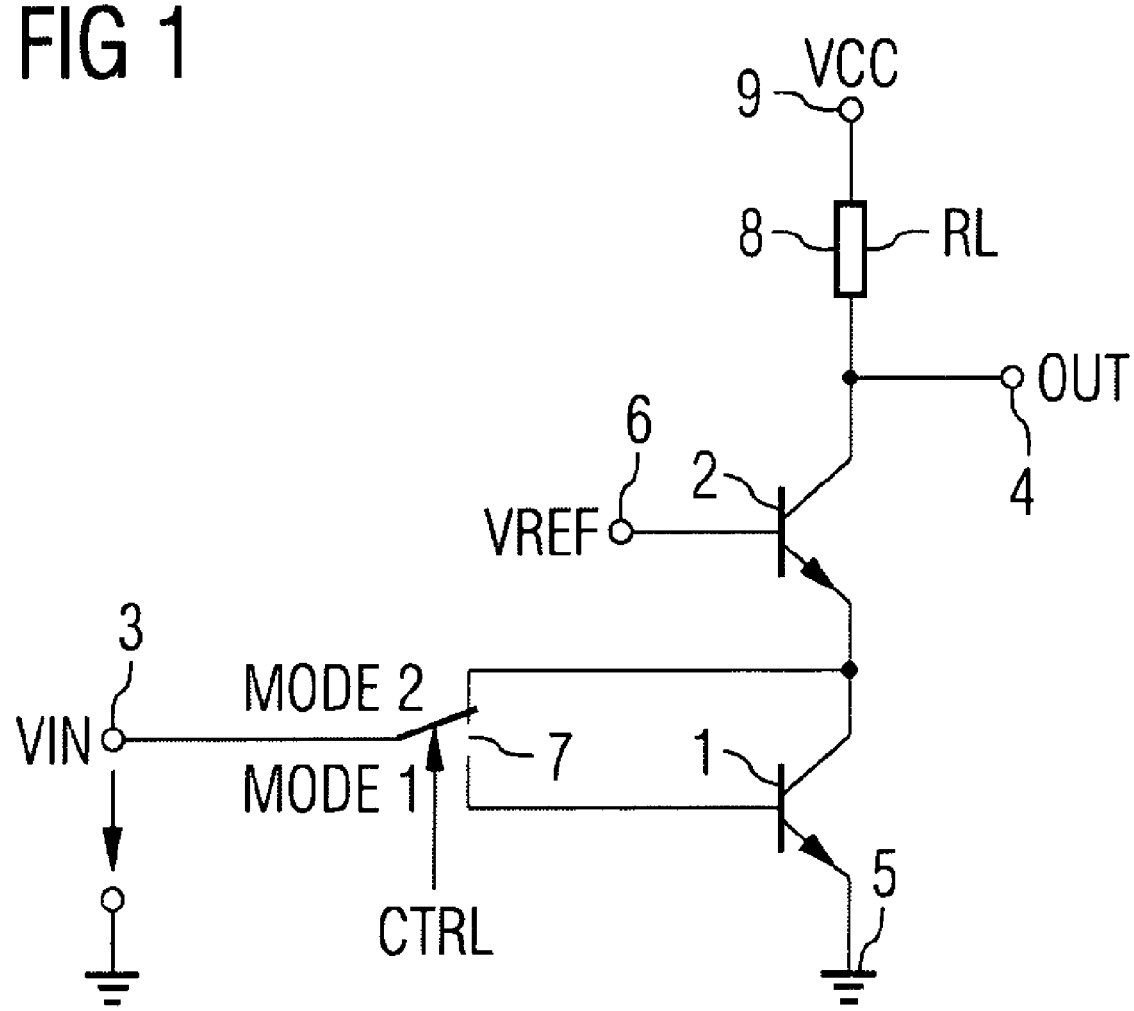
FIG. 1 shows a schematic of a first exemplary embodiment of the invention.

FIG. 1 shows a schematic of a first embodiment of an amplifier arrangement according to the invention presented as an example. The amplifier arrangement comprises a first transistor 1 and a second transistor 2. The first transistor 1 and the second transistor 2 form a transistor arrangement. This transistor arrangement 1, 2 is coupled between an input 3 to receive a signal to be amplified and an output 4 to provide an amplified signal.

The first transistor is switched in common-emitter configuration, while the second transistor 2 is connected in common-base figuration. The emitter terminal of the first transistor 1 is directly connected to a ground potential terminal 5. The base terminal of the second transistor 2 is directly connected to a reference potential terminal 6. A switching device 7 allows for switching between a first mode of operation of the amplifier arrangement and a second mode of operation of the amplifier arrangement. In the first mode of operation, the second transistor 2 is coupled to the first transistor 1 and the signal input 3 such that the second transistor forms a cascade stage with respect to the first transistor 1. In the second mode of operation, however, the second transistor 2 is coupled, in this case with its emitter terminal, to the input 3 of the amplifier arrangement. In the second mode of operation, the first transistor 1 is part of a current source for the second transistor 2. The output terminal 4 is formed at a free terminal of the second transistor 2. Here, the output terminal 4 is directly connected to the collector terminal of the second transistor. In addition to this, an electric load 8 is connected between a supply potential terminal 9 and the output 4.

Switch 7 connects, in a first switching position during the first mode of operation, the input 3 to the base terminal of the first transistor 1. In its second switching position during the second mode of operation, the switch 7 connects the input 3 to the emitter terminal of the second transistor 2.

In order to form a cascode configuration during the first mode of operation, the emitter terminal of the second transistor 2 is connected to the collector terminal of the first transistor 1.

In the first mode of operation, the input single VIN is fed into the base terminal of the first transistor 1 which by means of the second transistor 2 has a cascade stage. The amplified signal is provided at the output 4. The common-emitter transistor with cascade configuration results in high gain, low noise-figure and fair linearity in order to process low-level input signals.

In the second mode of operation, the input signal VIN is fed into the emitter terminal of the second transistor 2. In this mode, the transistor arrangement represents a common-base configuration. The second transistor 2, which in the first mode represents a cascade, is the input transistor in the second mode of operation. By doing this, during the second mode of operation, a lower gain is achieved which is desirable to process higher input level signals of the input signal VIN. A higher noise figure which might occur is acceptable due to the higher input level signal. In the second mode of operation, linearity is improved significantly. This higher linearity is achieved without the need for inductive degeneration. Especially, no external inductor is necessary.

In alternative embodiments, the bipolar transistors 1, 2 can be replaced by unipolar transistors, for example field effect transistors. In this case, the common-emitter configuration is realized by a common source configuration and the common base configuration is realized by a common gate configuration.

Figure 2:
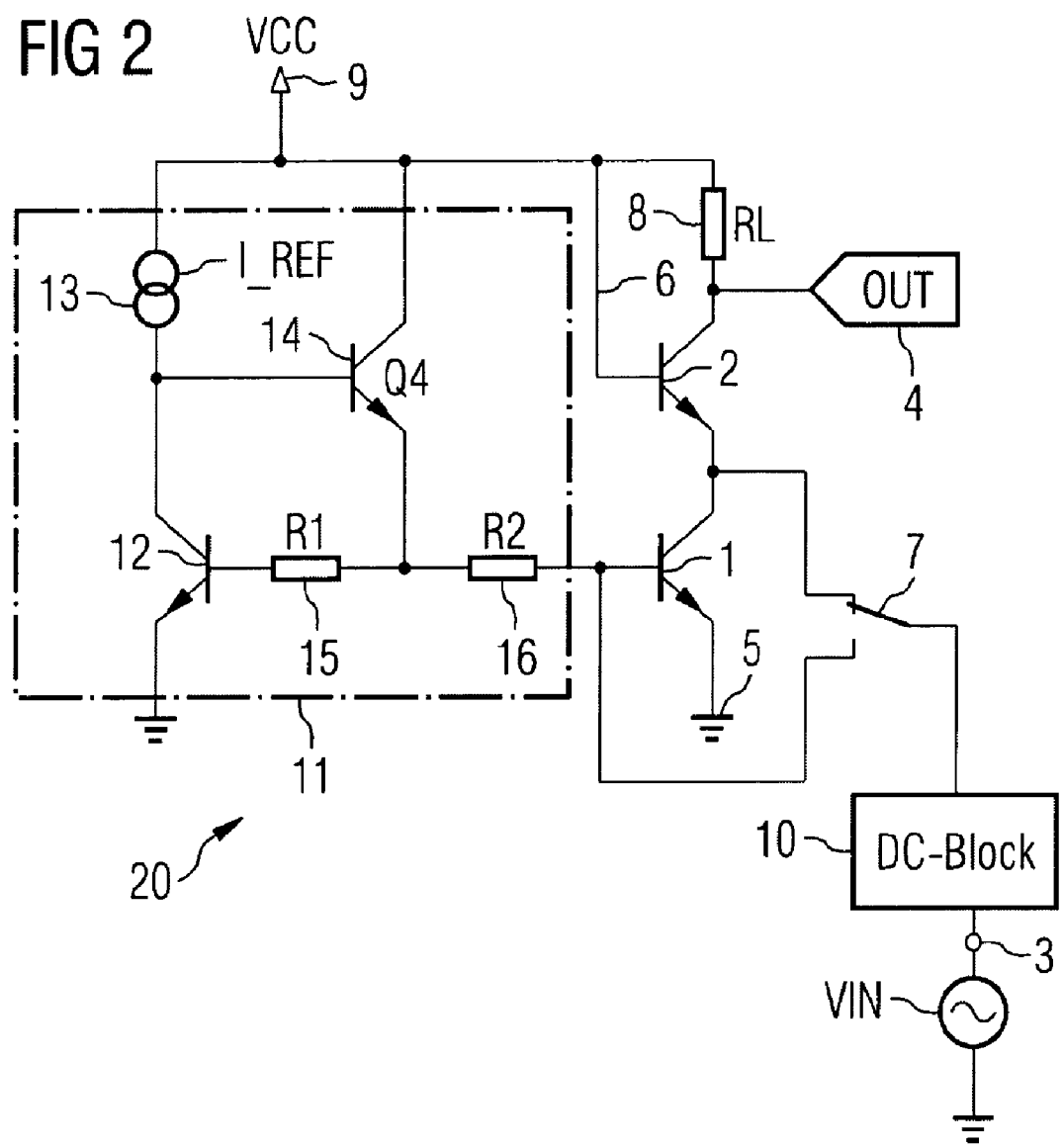
FIG. 2 shows a second exemplary embodiment of a schematic of the invention.

FIG. 2 shows a second exemplary embodiment of an amplifier arrangement according to the principle presented. As far as the circuits of FIGS. 1 and 2 correspond to each other in the parts used, their interconnection and their advantageous function, this description is not repeated here.

In addition to the switching device 7, FIG. 2 comprises means for blocking DC components 10 of the input signal VIN, which are connected between the input 3 and switch 7. These means for suppression of DC-components 10 may for example be realized as a series capacitor.

The reference potential terminal 6 is, according to FIG. 2, directly connected to the supply potential terminal 9.

Further on, a means for operating point adjustment 11 is provided which is connected to the base terminal of the first transistor 1. The means for operating point adjustment 11 comprises a third transistor 12 in common-emitter configuration, the collector terminal of which is connected, via a reference current source 13, to the supply potential terminal 9. Further on, the means for operating point adjustment 11 comprises a fourth transistor 14 in common-collector configuration. The base terminal of transistor 14 is connected to the collector terminal of third transistor 12, the emitter terminal of the fourth transistor 14 is connected, via a first resistor 15, to the base terminal of the third transistor 12 and, via a second resistor 16, to the base terminal of the first transistor 1. The collector terminal of the fourth transistor 14 is directly connected to the supply potential terminal 9.

The ratio of the values of first and second transistor 15, 16 sets the operating point.

The switching device 7 may, for example, be realized by using two complementary switched transmission gates or single transistors.

Figure 3:
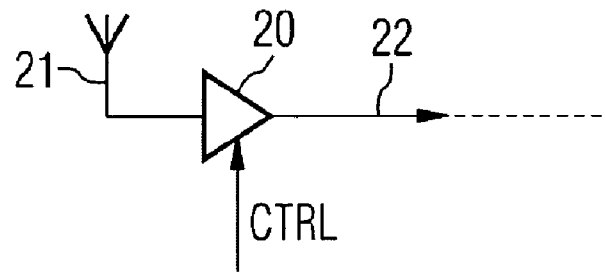
FIG. 3 shows an example of a radio receiver having an amplifier according to an embodiment of the invention.

In FIG. 3, an exemplary receiver arrangement for radio frequencies is shown. The amplifier arrangement according to the present invention, for example the amplifier arrangement 20 according to FIG. 2, is coupled to an antenna 21. Means for further signal processing 22 are provided downstream of the amplifier arrangement. Switching between the first mode of operation and the second mode of operation, different gain values and linearity characteristics can be achieved for processing a received signal as already explained above.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. Amplifier arrangement, comprising:
   an input to receive a signal to be amplified;
   an output to provide an amplified signal;
   a transistor arrangement comprising a first transistor in common-emitter configuration, and a second transistor in common-base configuration, which second transistor is coupled to the output of the amplifier arrangement;
   a switching device coupled to the transistor arrangement such that in a first mode of operation of the amplifier arrangement the first transistor is coupled to the input of the amplifier arrangement and the second transistor forms a cascade with respect to the first transistor, and such that in a second mode of operation of the amplifier arrangement the second transistor is coupled to the input of the amplifier arrangement, wherein the switching device couples the input of the amplifier arrangement to the transistor arrangement.

2. The amplifier arrangement according to claim 1, comprising means for DC-component suppression of a signal connected between the input of the amplifier arrangement and the switching device.

3. The amplifier arrangement according to claim 1, wherein in the second mode of operation the first transistor is configured to operate as a current source.

4. The amplifier arrangement according to claim 1, wherein the switching device is configured such that in the first mode of operation the input of the amplifier arrangement is coupled to the base terminal of the first transistor; and in the second mode of operation the input of the amplifier arrangement is coupled to the emitter terminal of the second transistor.

5. The amplifier arrangement according to claim 1, wherein the emitter terminal of the first transistor is connected to a ground potential terminal.

6. The amplifier arrangement according to claim 1, wherein the base terminal of the second transistor is connected to a reference potential terminal.

7. The amplifier arrangement according to claim 1, wherein the emitter terminal of the second transistor is connected to the collector terminal of the first transistor.

8. The amplifier arrangement according to claim 1, wherein the collector terminal of the second transistor is connected to a supply potential terminal via an electric load.

9. The amplifier arrangement according to claim 1, comprising a means for operating point adjustment connected to the base terminal of the first transistor.

10. The amplifier arrangement according to claim 9, wherein the means for operating point adjustment comprises:

a third transistor in common-emitter configuration, the collector terminal of which is connected, via a reference current source, to a supply potential terminal, and a fourth transistor in common-collector configuration, the base terminal of which is connected to the collector terminal of the third transistor and the emitter terminal of which is connected, via a first resistor, to the base terminal of the third transistor and, via a second resistor, to the base terminal of the first transistor.

11. The amplifier arrangement according to claim 1, wherein the switching device has a control input to receive a control signal and is designed to activate the first or second mode of operation as a function of a desired gain value of the amplifier arrangement.

12. The amplifier arrangement according to claim 1, wherein the amplifier arrangement is provided in monolithic integration as a bipolar circuit.

13. A receiver arrangement having an amplifier arrangement according claim 1, the amplifier arrangement is provided in a receive path of the receiver arrangement.

14. A low-noise amplifier in a receive path of a receiver arrangement, comprising an amplifier arrangement according to claim 1.

15. A method to amplify a signal with adjustable gain, comprising the steps of:

receiving a signal to be amplified;

amplifying the signal by means of a first transistor in common-emitter configuration having a cascade stage, in a first mode of operation, which cascade stage is formed by a second transistor;

amplifying the signal by means of the second transistor, which is in common-base configuration, during a second mode of operation;

providing an amplified signal; and feeding the signal to be amplified either to the first transistor in the first mode of operation or to the second transistor in the second mode of operation.

\* \* \* \* \*